(12) United States Patent
Krivokapic et al.

(10) Patent No.: US 9,997,695 B2
(45) Date of Patent: Jun. 12, 2018

(54) METHODS TO UTILIZE PIEZOELECTRIC MATERIALS AS GATE DIELECTRIC IN HIGH FREQUENCY RBTS IN AN IC DEVICE

(71) Applicant: GLOBALFOUNDRIES Inc., Grand Cayman (KY)

(72) Inventors: Zoran Krivokapic, Santa Clara, CA (US); Bichoy Bahr, Cambridge, MA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/458,316

(22) Filed: Mar. 14, 2017

(65) Prior Publication Data
US 2017/0222126 A1 Aug. 3, 2017

Related U.S. Application Data

(62) Division of application No. 15/014,212, filed on Feb. 3, 2016, now Pat. No. 9,673,376.

(51) Int. Cl.
| | |
|---|---|
| *H01L 29/84* | (2006.01) |
| *H01L 41/107* | (2006.01) |
| *H01L 41/047* | (2006.01) |
| *H01L 41/29* | (2013.01) |
| *H01L 29/78* | (2006.01) |

(52) U.S. Cl.
CPC ...... *H01L 41/107* (2013.01); *H01L 29/78391* (2014.09); *H01L 29/84* (2013.01); *H01L 41/0474* (2013.01); *H01L 41/29* (2013.01)

(58) Field of Classification Search
CPC ...................................................... H01L 29/84
See application file for complete search history.

(56) References Cited

U.S. PATENT DOCUMENTS

2015/0237423 A1  8/2015  Bahr et al.

FOREIGN PATENT DOCUMENTS

| CN | 101673753 A | 3/2010 |
| EP | 0468734 A1 | 1/1992 |
| JP | 5735099 B2 | 6/2015 |

OTHER PUBLICATIONS

Taiwanese Office Action for related Taiwanese Patent Application No. 105138841 dated Oct. 27, 2017, 6 Pages.

(Continued)

*Primary Examiner* — Marvin Payen
(74) *Attorney, Agent, or Firm* — Ditthavong & Steiner, P.C.

(57) ABSTRACT

Methods to utilize piezoelectric materials as a gate dielectric in RBTs in an IC device to generate and sense higher frequency signals with high Qs and resulting devices are disclosed. Embodiments include forming, on an upper surface of a semiconductor layer, RBTs comprising even multiples of sensing RBTs and driving RBTs, each RBT including a piezoelectric gate dielectric layer, a gate, and a dielectric spacer on opposite sides of the piezoelectric gate dielectric layer and gate, wherein at least one pair of sensing RBTs is directly between two groups of driving RBTs; forming metal layers, separated by interlayer dielectric layers, above the RBTs; and forming vias through a dielectric layer above the RBTs connecting the RBTs to a metal layer.

14 Claims, 9 Drawing Sheets

(56) References Cited

OTHER PUBLICATIONS

Bahr et al., "Theory and Design of Phononic Crystals for Unreleased CMOS-MEMS Resonant Body Transistors", Journal of Microelectromechanical Systems, vol. 24, No. 5, Oct. 2015, 14 Pages.
Bahr et al., "16.8 1GHz GaN-MMIC Monolithically Integrated MEMS Based Oscillators", 2015 IEEE International Solid-State Circuits Conference—(ISSCC), Feb. 22-26, 2015, 3 Pages.
Bahr et al., "Phononic Crystals for Acoustic Confinement in CMOS-MEMS Resonators", 2014 IEEE International Frequency Control Symposium (FCS), May 19-22, 2014, 4 Pages.

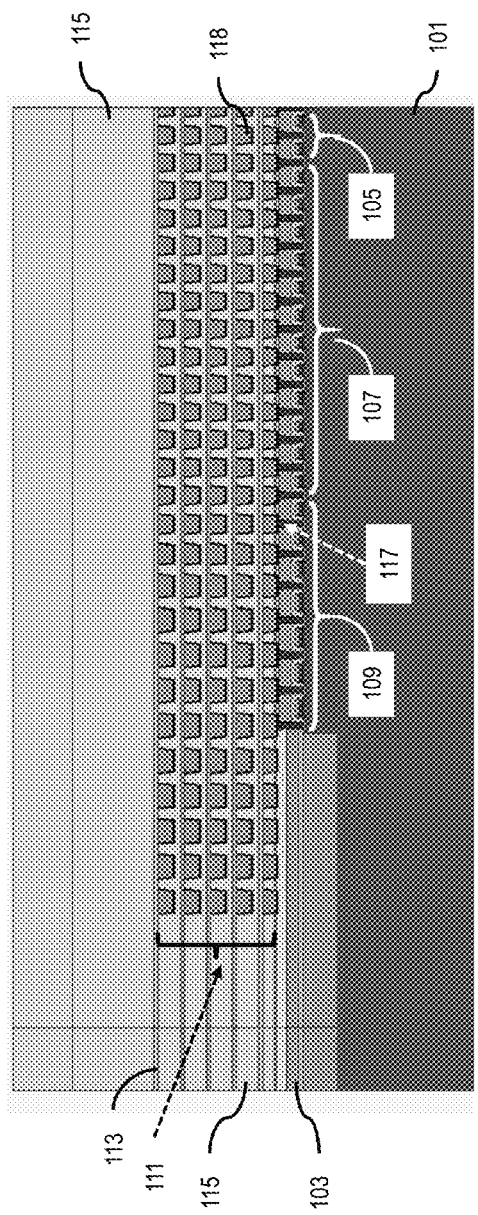
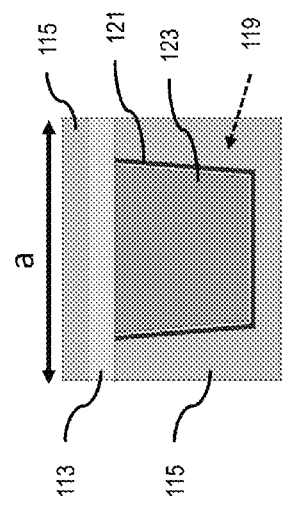
FIG. 1A
FIG. 1B

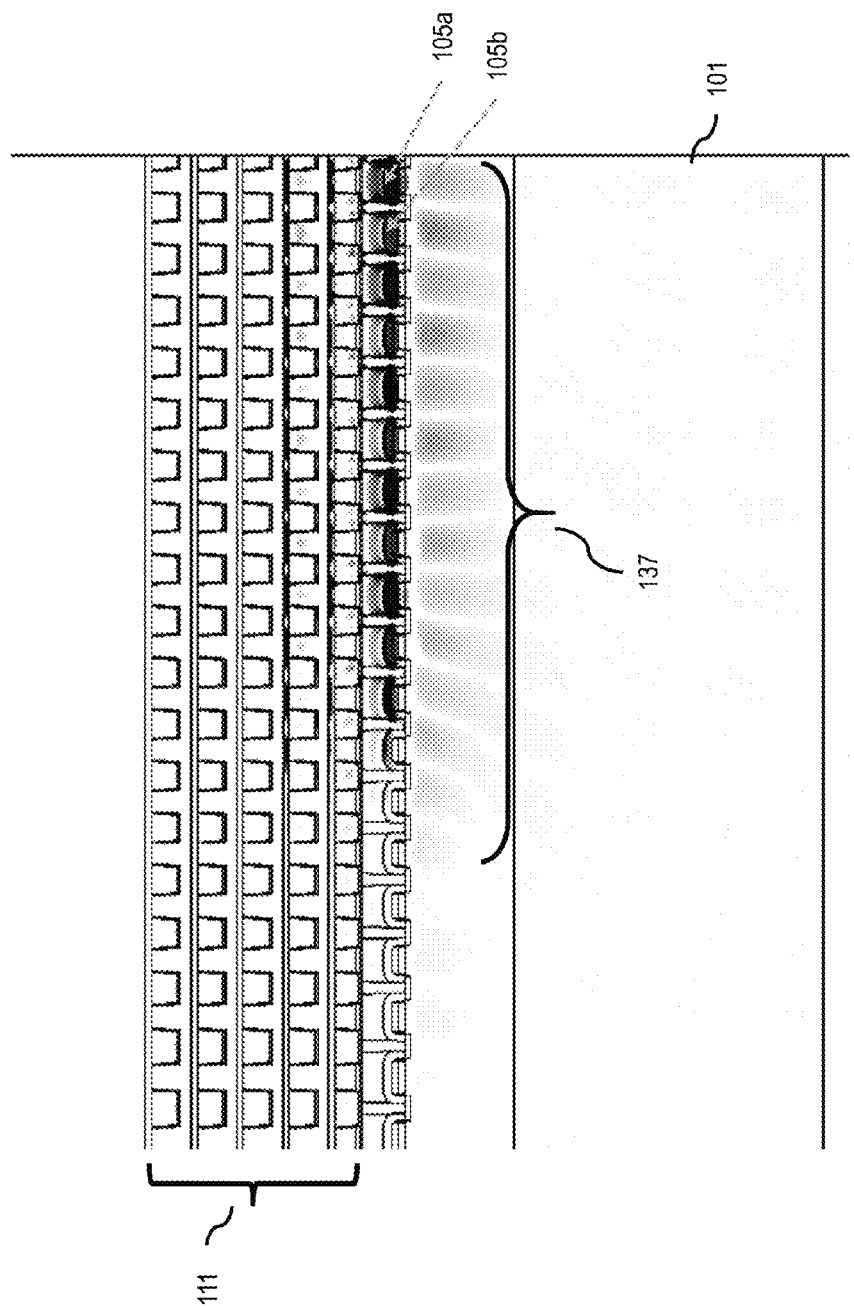

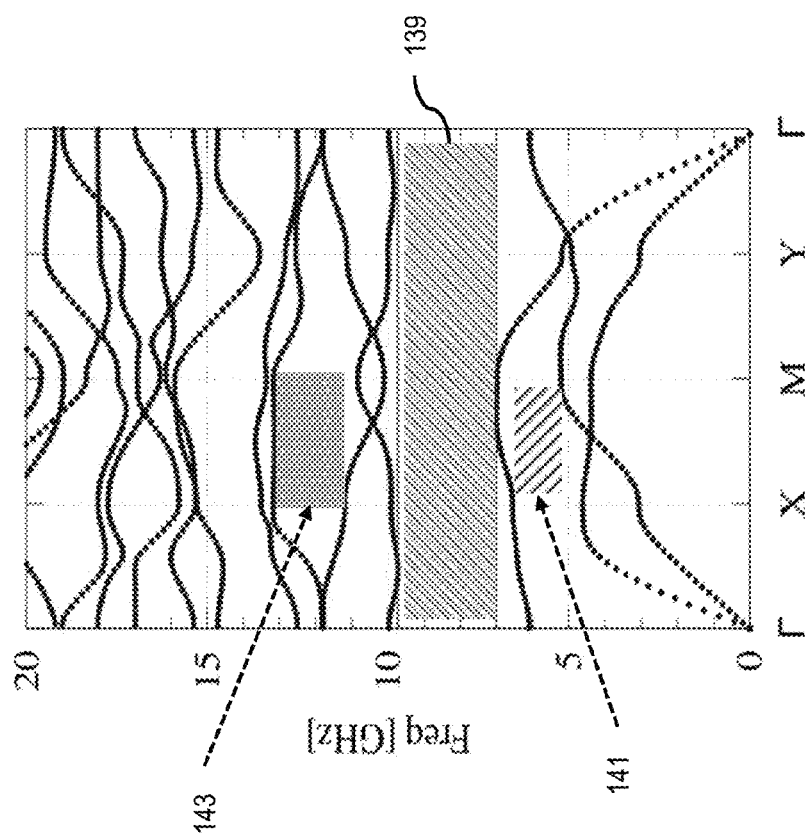
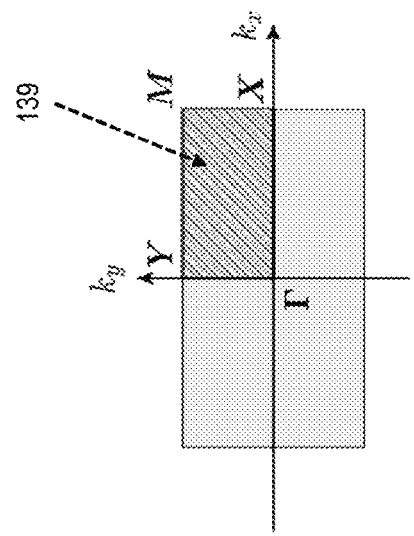
FIG. 1F
FIG. 1G

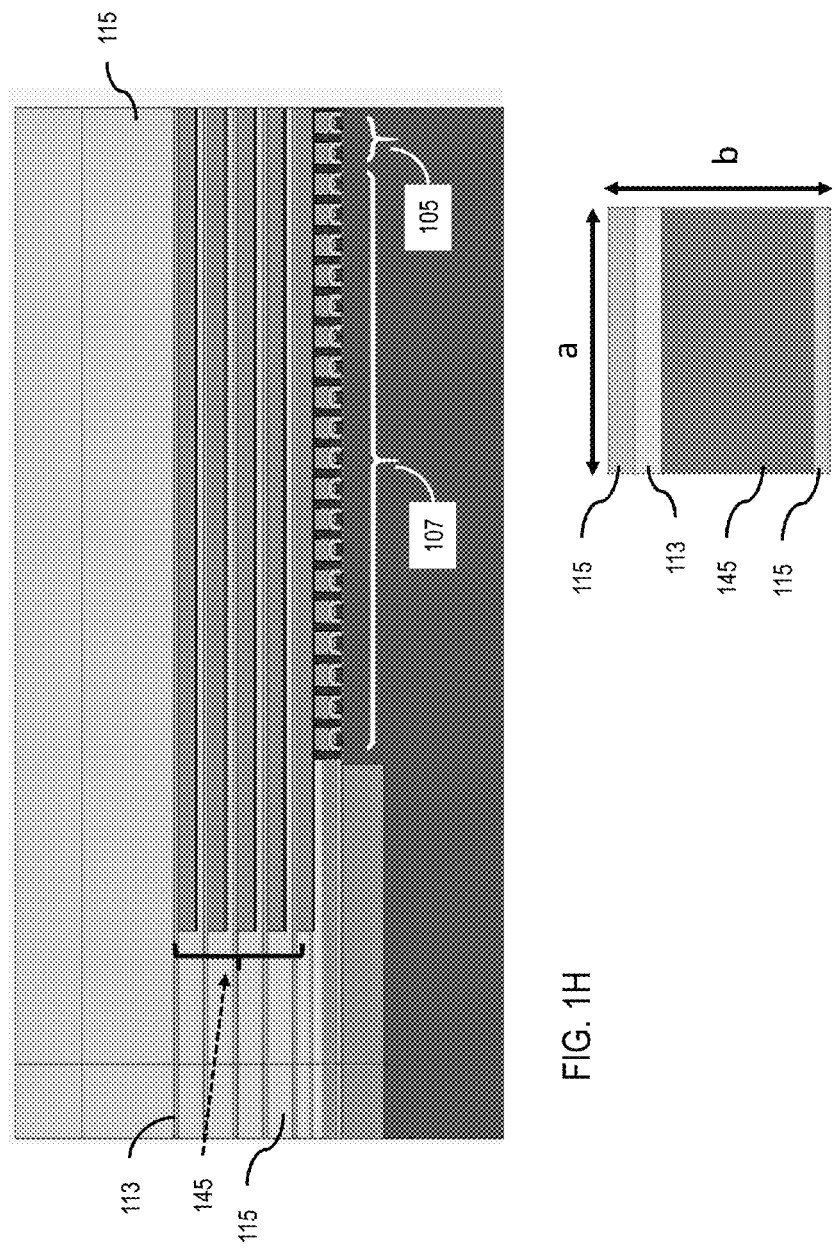

METHODS TO UTILIZE PIEZOELECTRIC MATERIALS AS GATE DIELECTRIC IN HIGH FREQUENCY RBTS IN AN IC DEVICE

CROSS-REFERENCE TO RELATED APPLICATION

This application is a Divisional of U.S. application Ser. No. 15/014,212, filed Feb. 3, 2016, the content of which is incorporated herein by reference in its entirety.

TECHNICAL FIELD

The present disclosure relates generally to designing and fabricating integrated circuit (IC) devices. The present disclosure is particularly applicable to integrating high frequency resonant body transistors (RBTs) in IC devices for the 28 nanometer (nm) technology node and beyond.

BACKGROUND

Generally, IC devices utilize various frequency sources in generating clock signals for use by different logic and/or analog circuits in the IC devices. High-Q filters can be used to create oscillators by incorporating them in a positive feedback loop with amplifiers providing adequate gain. Such oscillators are essential as a signal source for communication systems as well as analog electronics. They can also be used as a clock source for digital electronics. High-Q filters are also used in communication systems to select specific bands and channels, eliminate interferers, and suppress spurious transmissions, among many other uses. The higher the quality factor Q of the filter, the better selectivity it provides for different channels and bands, as well as lower phase noise and jitter for the oscillators constructed by such filters. However, the scaling to GHz-frequency bands and even 10's of GHz, renders the design of high-Q filters very challenging. Further, complete system integration on chip is becoming the only way to meet the ever increasing demand for the reduction of size, weight and power consumption of electronic systems.

The ability to construct inductors from CMOS metallization layers allows for creation of on-chip LC tank circuits. These are monolithically integrated electrical resonators and can easily achieve 10's of GHz frequencies. However, they suffer from low-quality factor (Q<50) and high electrical losses. In addition, on-chip inductors usually occupy a large die area that cannot be populated by other devices, hence increasing the overall system cost. Quartz crystals have dominated the high-precision oscillators market for half a century owing to their high-quality factors (Q~$10^5$), low insertion loss and low temperature coefficient. However, Quartz crystals are limited to a few 100 MHz and are difficult to scale to GHz frequencies. Their integration in CMOS ICs has proven to be quite challenging due to the incompatible fabrication processes.

Monolithic integration of mechanical resonators for filter applications into CMOS ICs has been the focus of multiple research efforts over the past 3 decades. Filters relying on mechanical resonators, show superior performance over the electrical LC tank circuits. Micro-electro-mechanical systems (MEMS) resonators with quality factors often exceeding $10^4$, small size (1000× smaller than on-chip LC tanks), and the capacity for integration with CMOS circuits make them a potential solution for current timing and RF challenging demands. MEMS devices and resonators usually incorporate moving surfaces. Some of these surfaces must be free boundaries, and often the entire MEMS device has to be suspended. Hence MEMS devices usually incorporate sacrificial layers that are used to support the device during the fabrication process and then are etched away in a release process to create a freely suspended device. Multiple efforts to integrate MEMS resonators in CMOS processes are available, including MEMS first, MEMS last, MEMS above IC and CMOS-MEMS. With the MEMS first technique, the MEMS device is fabricated before the CMOS circuit and protected by passivation layers during the CMOS circuits processing. When CMOS processing is done, the MEMS device is exposed and released by etching the sacrificial layers. The MEMS last technique relies on fabricating the CMOS circuits first. When the CMOS circuit is complete, it is passivated and protected when the MEMS device is fabricated. The MEMS device is then released to create the required freely suspended structures. In both these techniques, the MEMS device ends up consuming valuable CMOS area.

MEMS above ICs technique relies on growing the MEMS device on top of the completed CMOS die, followed by the necessary release steps. In all the above mentioned techniques, the sequential processing the MEMS and CMOS always results in a limited thermal budget for one or the other. Also, the CMOS or MEMS yield may be significantly compromised by virtue of the extra processing. CMOS-MEMS devices are used to refer to the devices formed by patterning and etching the back-end-of-line (BEOL) layers of the completed CMOS die. The CMOS-MEMS BEOL fabrication technique has been successfully applied to MEMS resonators in the low MHz range. Scaling to GHz-frequencies is a challenge, since it requires smaller dimensions, whereas the CMOS BEOL process usually have large critical dimensions (CD) compared to the front-end-of-line (FEOL) process. CMOS-MEMS BEOL devices usually incorporate large air gaps as defined by the BEOL CD, which dictates higher operating voltage (10's of Volts) for the MEMS device, and complicates the interfacing with CMOS circuits.

Film Bulk Acoustic wave Resonators (FBAR) are another variant of MEMS resonators which is widely adopted as filters in the RF industry. FBARs offer high-Q and low insertion loss, but their resonance frequency is determined by the layer thickness as they are thickness-mode devices. This limits their application to a single frequency per wafer in the case of integration with CMOS.

Some IC devices may utilize RBTs as an onchip frequency source providing higher frequency and lower phase noise improvements over traditional solutions such as inductor-capacitor (LC) tanks, quartz crystals, or FBARs. CMOS RBTs are unreleased MEMS resonators implemented as an integral part of the CMOS FEOL and BEOL process, without any extra release or passivation steps. They are fabricated just like any regular FET in the CMOS process. With the lack of a release step and extra post-processing, CMOS RBTs do not compromise the yield of the CMOS process or the RBT itself. Also, as unreleased devices with no air gaps, they are inherently encapsulated in the CMOS die and do not require any special packaging or hermetic sealing. CMOS RBTs incorporate a mechanical resonance cavity located in the FEOL layers of the CMOS process. The RBT resonance cavity is defined from the top by 1D, 2D or 3D phononic crystal (PnC) formed from the metal and dielectric BEOL layers of the CMOS processes. Total internal reflection from the CMOS bulk wafer is used to achieve energy confinement from the bottom, which together with the PnC define the cavity vertical dimensions. Patterning of FEOL layers is used to construct in-plane reflectors achieving horizontal energy confinement and define the horizontal cavity dimensions. CMOS RBTs make use of a regular FET from the CMOS technology for active FET sensing. The mechanical stresses in the acoustic resonance cavity modulate the mobility of the FET channel resulting in a small signal current in the external circuit when the FET is biased properly.

However, the current RBTs use capacitive driving and sensing methods that generate weak (e.g. 1 micro-siemens (µS)) frequency signals requiring amplification by a transimpedance amplifier to obtain an oscillating/clock signal. CMOS RBTs are electrostatically driven by the help of MOS Capacitors (or regular FETs used as capacitors) available in CMOS FEOL. Modulation of the charge on the MOS capacitor (through the gate voltage) causes a modulation of the electrostatic voltage induced by these charge, and inducing mechanical stress in the structure. CMOS RBTs benefit from the small CDs available for the FEOL of CMOS and are inherently scalable to GHz-frequencies. CMOS RBTs are also small in size spanning only few micrometers, hence they do not consume costly die area. With the CMOS RBTs available directly in the FEOL of the CMOS die, interconnects parasitic to CMOS circuits are minimal compared to any other integration scheme. However, methods to reduce/prevent propagation of the acoustic energy into different parts (e.g. substrate) of an IC device may limit availability of different frequency signals that may be produced by the RBTs.

Therefore, a need exists for a methodology enabling utilization of RBTs to generate and sense higher frequency signals with high quality factors (Qs) in an IC device and the resulting device.

SUMMARY

An aspect of the present disclosure is a method of enabling utilization of piezoelectric materials as a gate dielectric in RBTs in an IC device to generate and sense higher frequency signals with high Qs.

Another aspect of the present disclosure is an IC device including piezoelectric materials as a gate dielectric in RBTs for generating and sensing higher frequency signals with high Qs.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including forming, on an upper surface of a semiconductor layer, RBTs comprising even multiples of sensing RBTs and driving RBTs, each RBT including a piezoelectric gate dielectric layer, a gate, and a dielectric spacer on opposite sides of the piezoelectric gate dielectric layer and gate, wherein at least one pair of sensing RBTs is directly between two groups of driving RBTs; forming metal layers, separated by interlayer dielectric layers, above the RBTs; and forming vias through a dielectric layer above the RBTs connecting the RBTs to a metal layer.

An additional aspect includes forming a piezoelectric dielectric layer over source/drain (S/D) regions in the semiconductor layer and adjacent to each dielectric spacer. In one aspect, the metal layers are solid layers and form a one-dimensional phononic crystal.

Another aspect includes segmenting the metal layers for forming a two-dimensional phononic crystal.

A further aspect includes forming a group of termination RBTs adjacent to the driving RBTs.

One aspect includes connecting a direct current (DC) gate voltage to a gate of each sensing RBT to cause an inversion state in the sensing RBT; and connecting a combination of a DC voltage and a radio frequency (RF) signal to a source terminal, a drain terminal, or a combination thereof of the sensing RBT, wherein a phase of the RF signal is an opposite phase of the RF signal at an adjacent RBT.

In one aspect, the DC gate voltage is a positive DC voltage for an n-type RBT and a negative DC voltage for a p-type RBT.

An additional aspect includes connecting a DC voltage to a gate of each driving RBT; and connecting an RF signal to the gate or to a source terminal, a drain terminal, or a combination thereof, wherein a phase of the RF signal is an opposite phase of the RF signal at an adjacent RBT.

Another aspect of the present disclosure is a device including: RBTs, on an upper surface of a semiconductor layer, comprising even multiples of sensing RBTs and driving RBTs, each RBT including a piezoelectric gate dielectric layer, a gate, and a dielectric spacer on opposite sides of the piezoelectric gate dielectric layer and gate, wherein at least one pair of sensing RBTs is directly between two groups of driving RBTs; metal layers, separated by interlayer dielectric layers, above the RBTs; and vias through a dielectric layer above the RBTs connecting the RBTs to a metal layer.

One aspect includes a piezoelectric dielectric layer over S/D regions in the semiconductor layer and adjacent to each dielectric spacer. In another aspect, the metal layers are solid layers and form a one-dimensional phononic crystal.

In one aspect the metal layers are segmented, forming a two-dimensional phononic crystal structure.

A further aspect includes a group of termination RBTs adjacent to the driving RBTs.

An additional aspect includes a DC gate voltage connection to a gate of each sensing RBT causing an inversion state in the sensing RBT; and a combination of a DC voltage and an RF signal connection to a source terminal, a drain terminal, or a combination thereof of the sensing RBT, wherein a phase of the RF signal is an opposite phase of the RF signal at an adjacent RBT.

In one aspect, the DC gate voltage connection is to a positive DC voltage source for an n-type RBT and to a negative DC voltage source for a p-type RBT.

A further aspect includes a DC voltage connection to a gate of each driving RBT; and an RF signal connection to the gate or to a source terminal, a drain terminal, or a combination thereof, wherein a phase of the RF signal is an opposite phase of the RF signal at an adjacent RBT for a differential drive operating mode.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 1A illustrates a cross sectional view of a semiconductor substrate including a 2D PnC, in accordance with an exemplary embodiment;

FIG. 1B illustrates a single cell unit of a metal layer of the 2D PnC of FIG. 1A, in accordance with an exemplary embodiment;

FIG. 1E illustrates a graphical representation of acoustic energy in the 2D PnC of FIG. 1A, in accordance with an exemplary embodiment;

FIGS. 1F and 1G illustrate graphical representations of frequency bands of the 2D PnC of FIG. 1A, in accordance with exemplary embodiments;

FIG. 1H illustrates a cross sectional view of a semiconductor substrate including a 1D PnC, in accordance with an exemplary embodiment;

FIG. 1I illustrates a single cell unit of a metal layer of the 1D PnC of FIG. 1H, in accordance with an exemplary embodiment;

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of limitations attendant upon generating high frequency signals with high quality factors by utilizing PnCs in an IC device. The present disclosure addresses and solves such problems, for instance, by, inter alia, utilizing piezoelectric materials instead of conventional gate dielectric materials in RBTs.

PnCs are 1D, 2D or 3D periodic structures characterized by bandgaps in their dispersion relations. When elastic waves are incident on a PnC with a frequency that lies in the PnC bandgap, such waves cannot propagate in the PnC due the absence of an eigenmode vibrational mode of the structure that can support their propagation. As a result, such waves decay evanescently in the PnC which results in strong reflection of the incident waves. PnCs act as high-reflectivity acoustic mirrors for frequencies in their bandgaps. To construct PnCs, materials with high acoustic impedance (ratio of the wave stress to displacement velocity) contrast are required. Materials available in the CMOS BEOL layers such as Copper metallization, tungsten, low-k dielectrics, silicon dioxides, copper capping layers, etch stop layers, anti-reflecting coatings, etc., present such high acoustic impedance contrast, which makes them ideal for forming PnCs. PnCs constructed from copper metallization and low-k dielectric have been used for acoustic confinement from the top for prior CMOS-RBTs.

Figure 1C:
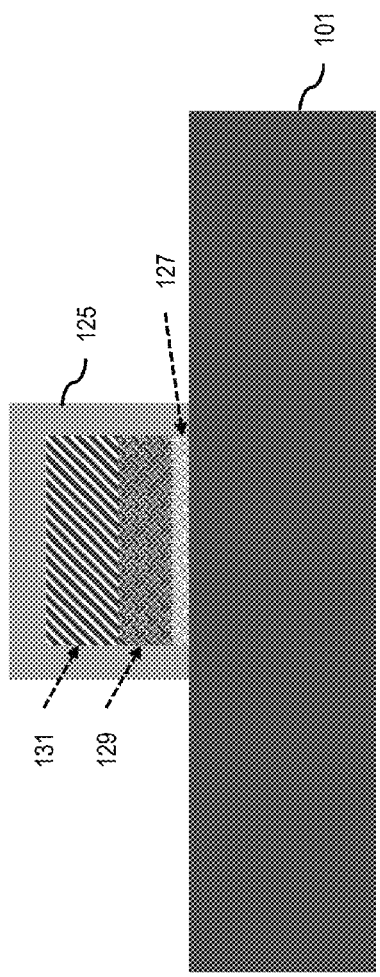
FIGS. 1C and 1D illustrate formation of an RBT gate structure of a PnC including piezoelectric gate dielectric material, in accordance with an exemplary embodiment.

FIG. 1A illustrates a cross sectional view of a semiconductor substrate 101 (e.g., silicon (Si), silicon-germanium (SiGe), Ge, indium-gallium-arsenide (InGaAs), etc.), a dielectric layer 103 on a section of an upper surface of the substrate layer 101, sensing RBTs 105, driving RBTs 107, and termination RBTs 109 (e.g. to help decrease an intensity/power of an acoustic signal). Each RBT 105, 107 and 109 includes a gate and a piezoelectric gate dielectric layer, as illustrated in FIG. 1C. Segmented/patterned metal layers 111, separated by dielectric layers 113 and interlayer dielectric layers 115, may be formed above the RBTs. Through vias 117 may be formed (e.g. through a dielectric layer 103) to provide a connectivity channel between the RBTs 105, 107 and 109, and a metal layer 111 (e.g. metal one) above the RBTs. The interlayer dielectric layers 115 may be of a low-k dielectric material (e.g. SiCOH) formed between the segments of the metal layers 111 as well as between the interlayer dielectric layers 113. A length of a gate may, for example, be 48 nm, a width of a metal layer 111 may be 122 nm with a separation of 82 nm between adjacent metal segments 118. The segmented metal layers 111 may form a two dimensional PnC structure.

FIG. 1B illustrates a single cell unit of a metal layer 111, with a width of a, including the dielectric layers 113 and 115, a cavity 119 including a liner 121 (e.g. TaN/Ta) and a metal filling 123 (e.g. copper).

Figure 1D:
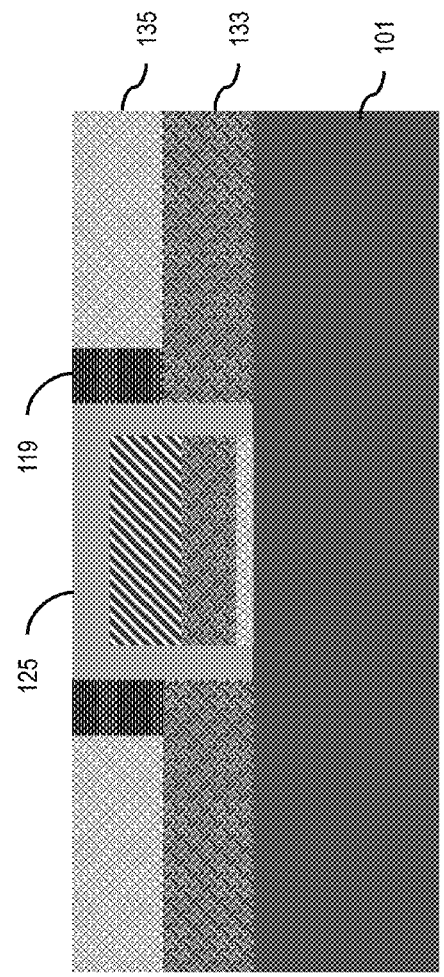

FIG. 1C illustrates an RBT gate structure including a dielectric spacer 125 (e.g., silicon nitride (SiN), silicon dioxide ($SiO_2$)), an interfacial dielectric layer 127 (e.g. 0.5 nm thick $SiO_2$) on an upper surface of the substrate 101, a piezoelectric (i.e., ferroelectric or anti-ferroelectric) gate dielectric layer 129 (e.g. 2 to 5 nm in thickness), and a gate 131 (e.g., formed of polysilicon plus a silicide, metal, etc.). The gate dielectric layer 129 may, for example, be formed of hafnium zirconium oxide (HfZrO) or hafnium oxide ($HfO_2$) doped with silicon (Si), aluminum (Al), gadolinium (Gd), or the like. As illustrated in FIG. 1D, after the gate formation, additional piezoelectric dielectric layers 133 (e.g., 10 to 15 nm in thickness) may be formed on the upper surface of the substrate 101, on opposite sides of the dielectric spacer 125, over S/D regions in the substrate 101. An interlayer dielectric layer 135 may be formed on an upper surface of the piezoelectric dielectric layers 133, wherein through vias 119 form connectivity channels through the interlayer dielectric layers 135, on opposite sides of the dielectric spacer 125, to the upper surfaces of the piezoelectric dielectric layers 133. A gate of each sensing RBT may be connected to a bias DC voltage (e.g. greater than a threshold voltage) to cause an inversion state in the sensing RBT, wherein the DC voltage may be a positive voltage for an n-type (e.g. NMOS) RBT and a negative voltage for a p-type (e.g. PMOS) RBT. A combination of a DC voltage and an RF signal may be connected to a source terminal, a drain terminal, or a combination thereof of the sensing RBT, wherein a phase of the RF signal is an opposite phase (e.g., antiphase, alternating) of the RF signal at an adjacent RBT. Further, a DC voltage may be connected to a gate of each driving RBT, and an RF signal may be connected to the gate or to a source terminal, a drain terminal, or a combination thereof, wherein a phase of the RF signal is an opposite phase of the RF signal at an adjacent RBT.

FIG. 1E illustrates a partial view of the RBTs in FIG. 1A, where acoustic energy/waves 137 produced by each neighboring RBT (e.g., 105a and 105b) is either tensile or compressive (e.g. 180° out of phase), which may be defined by $k_x=\pi/a$, where the width of the cell unit is a (e.g. as in FIG. 1B). Acoustic energy in a bulk device has to be confined in all directions. 2D phononic crystals made of metal lines and interlayer dielectric, which have high contrast in acoustic impedance, prevent loses above the mechanical resonators. The lateral isolation is done by using acoustic Bragg reflectors (ABR) but they are efficient only for a given wavelength (shallow trench isolation and silicon islands have to be separated by a quarter of wavelength). Mechanical resonators in bulk CMOS have many available frequencies but ABRs would be useful only for one. The loss in the bulk is prevented by using differential driving. The substrate 101 (e.g. bulk wafer) may be considered to be a continuous and homogeneous medium approximated as infinitely large when compared to typical wavelengths of resonant RBT structures. Eigenmodes of the substrate 101 may be considered to be plane waves with a linear dispersion relation as $\omega=c|k|$, where c is the wave velocity (e.g. for both longitudinal and shear waves) in the substrate 101 and $|k|$ is the magnitude of the total wave vector that is composed of $k_x$ and $k_y$. A certain $k_x$ component may be enforced by having an excitation with certain spatial periodicity, where the dispersion relation of the plane waves in the substrate 101 may be stated as $\omega>c\ k_x$ (where $k_y$ may assume arbitrary values for given $k_x$). Thus, for a given $k_x$ (due to the excitation periodicity), waves with frequency $\omega>c\ k_x$ may freely propagate in the substrate 101. For a given $k_x$, waves with frequency $\omega<ck_x$ may decay in the substrate 101 resulting in a total reflection. Thus, natural vibrational modes with $k_x=\pi/a$ and frequency lower than $\omega=c_{Shear}\ \pi/a$, may be completely reflected from the substrate 101. If the frequencies of such modes also fall into the bandgap of the PnC structure, they may be reflected from the PnC as well and become trapped between BEOL PnC metal layers 111 and the substrate 101, hence, achieving vertical confinement.

FIGS. 1F and 1G illustrate graphical representations of frequency bands in a 2D PnC. FIG. 1F illustrates a 2D PnC frequency bandgap 139, e.g. 7 to 10 GHz, which is also illustrated in FIG. 1G as an irreducible Brillouin Zone (IBZ) graph. Additionally, FIG. 1F illustrates partial bandgaps 141 and 143 of other frequencies in X-M.

FIG. 1H illustrates sensing RBTs 105, driving RBTs 107, and solid metal layers 145 to form a one dimensional (1D) PnC structure. FIG. 1I illustrates a single cell unit, with a width of a and a height of b, including metal layer 145 (e.g. copper) and the dielectric layers 113 and 115.

Figure 1J:
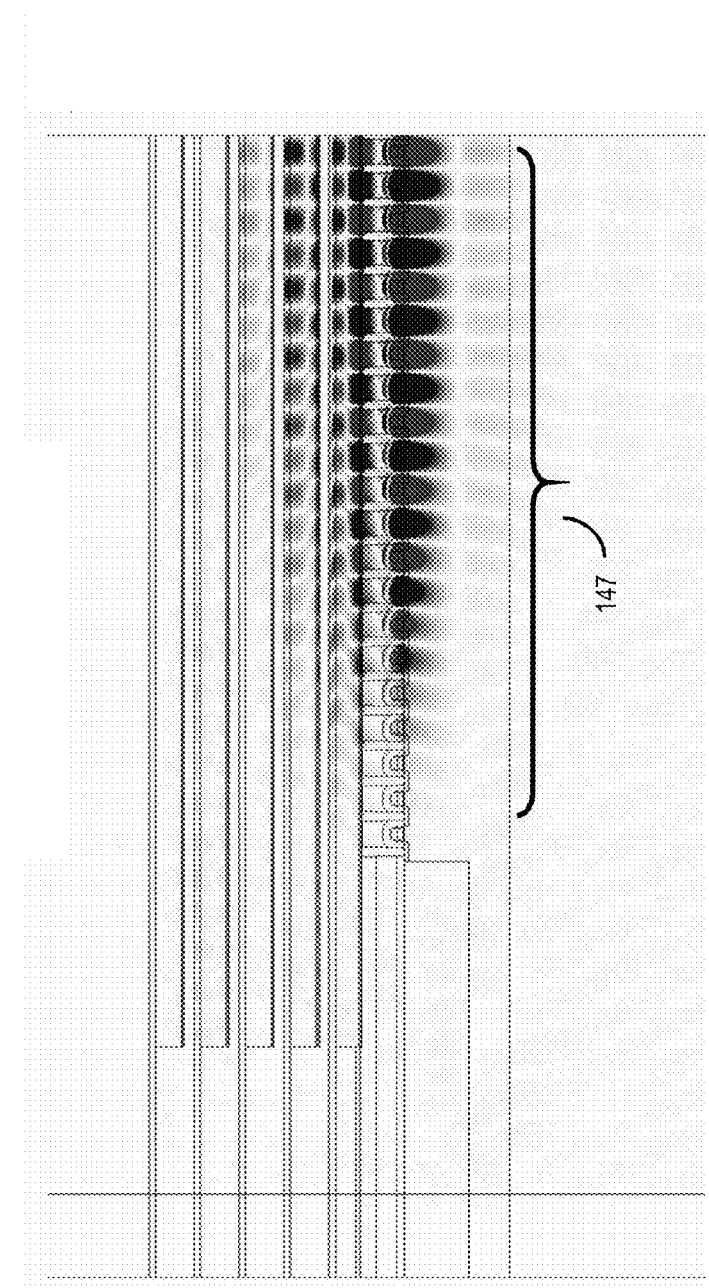
FIG. 1J illustrates a graphical representation of acoustic energy in the 1D PnC of FIG. 1H, in accordance with an exemplary embodiment.

As illustrated in FIG. 1J, a 1D PnC structure may enable sufficient confinement of the acoustic energy 147 of higher frequencies without a need for termination gates (e.g. of RBTs 109 in FIG. 1A). However, the signal at the sensing gates may be weak.

Figure 1K:
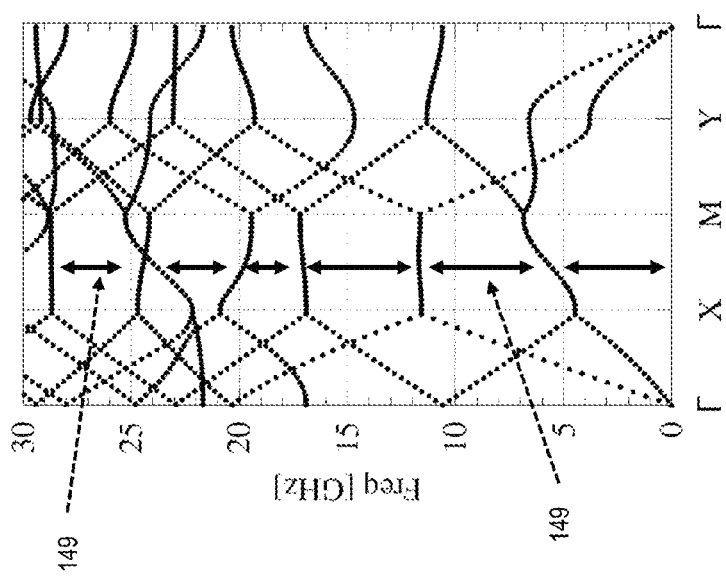
FIGS. 1K and 1L illustrate graphical representations of frequency bands of the 1D PnC of FIG. 1H, in accordance with exemplary embodiments.
Figure 1L:
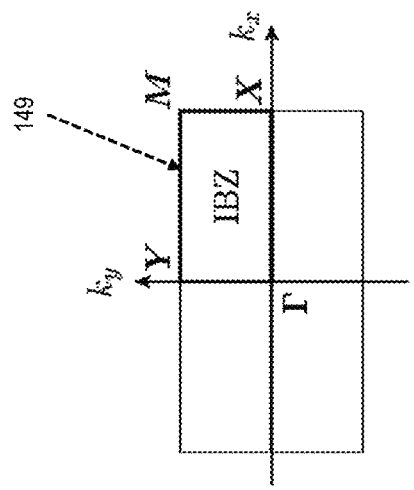

FIGS. 1K and 1L illustrate graphical representations of frequency bandgaps in a 1D PnC. FIG. 1K illustrates multiple partial bandgaps 149 along the X-M direction in a K-space corresponding to $k_x=\pi/a$ and $k_y$ assuming values from 0 to $\pi/b$, where a and b correspond to dimensions of the cell unit in FIG. 1I. Illustrated in FIG. 1L is a corresponding IBZ graph including the bandgaps 149.

Figure 1M:
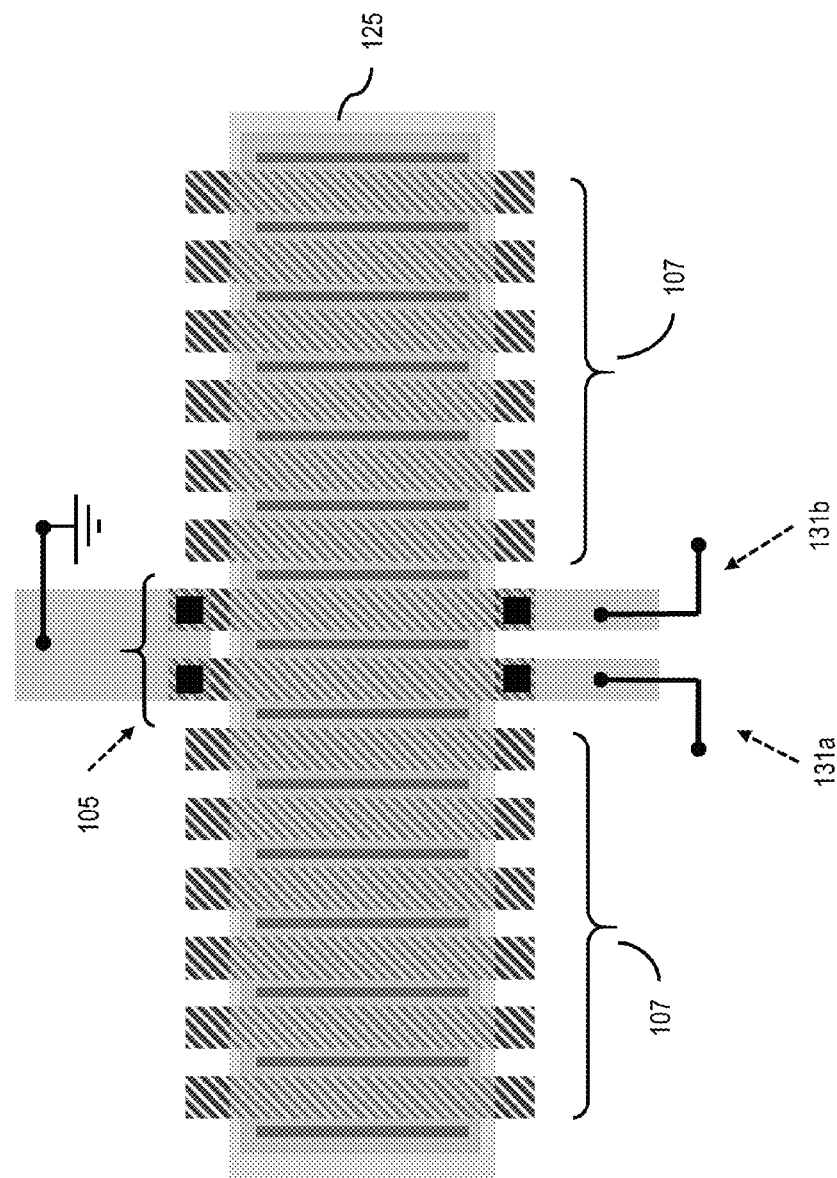
FIG. 1M illustrates a top view of the 1D PnC of FIG. 1H, in accordance with an exemplary embodiment.

FIG. 1M illustrates a top view of a 1D PnC including the gate dielectric spacer 125 over a pair of sensing RBTs 105 positioned directly between two groups of driving RBTs 107. This sensing scheme improves the signal at the sensing gates.

Figure 1N:
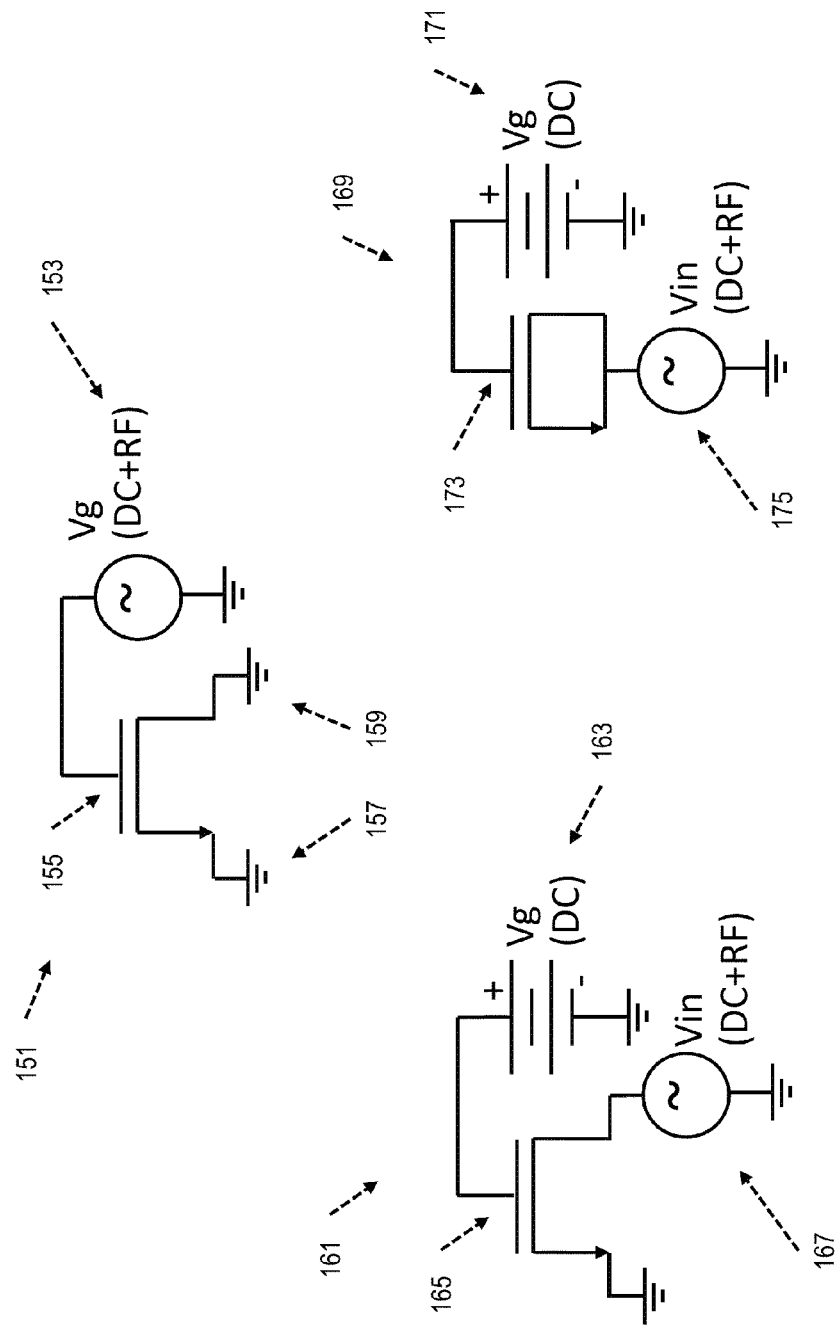
FIG. 1N includes schematic illustrations of electrical connectivity configurations of the RBTs of FIGS. 1A and 1H, in accordance with exemplary embodiments.

FIG. 1N includes schematic illustrations of electrical connectivity configurations of RBTs. For example, for an RBT 151, a combination of a DC+RF signals 153 may be applied to a gate terminal 155 while S/D terminals 157/159 may be connected to a common ground. Alternatively, for an RBT 161, a DC gate signal 163 may be applied to a gate terminal 165, and a combination of a DC+RF signals 167 may be applied to the D terminal (or S) while the S terminal (or D) may be grounded. Further, for an RBT 169, a DC gate signal 171 may be applied to a gate terminal 173 while a combination of a DC+RF signals 175 may be applied to S/D terminals. Size and electrical connection of each RBT may indicate functionality of the RBT as a sensing RBT, a driving RBT, or a termination RBT.

The embodiments of the present disclosure can achieve several technical effects including utilization of piezoelectric materials as a gate dielectric in RBTs in an IC device to generate and sense higher frequency signals with high Qs. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.), particularly for the 28 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   resonant body transistors (RBTs), on an upper surface of a semiconductor layer, comprising even multiples of sensing RBTs and driving RBTs, each RBT including a piezoelectric gate dielectric layer, a gate, and a dielectric spacer on opposite sides of the piezoelectric gate dielectric layer and gate, wherein at least one pair of sensing RBTs is directly between two groups of driving RBTs;
   metal layers, separated by interlayer dielectric layers, above the RBTs; and
   vias through a dielectric layer above the RBTs connecting the RBTs to a metal layer.

2. The device according to claim 1, further comprising:
   a piezoelectric dielectric layer over source/drain (S/D) regions in the semiconductor layer and adjacent to each dielectric spacer.

3. The device according to claim 1, wherein the metal layers are solid layers and form a one-dimensional phononic crystal.

4. The device according to claim 1, wherein:
the metal layers are segmented, forming a two-dimensional phononic crystal structure.

5. The device according to claim 4, further comprising:
a group of termination RBTs adjacent to the driving RBTs.

6. The device according to claim 1, further comprising:
a direct current (DC) gate voltage connection to a gate of each sensing RBT causing an inversion state in the sensing RBT; and
a combination of a DC voltage and a radio frequency (RF) signal connection to a source terminal, a drain terminal, or a combination thereof of the sensing RBT, wherein a phase of the RF signal is an opposite phase of the RF signal at an adjacent RBT.

7. The device according to claim 6, wherein the DC gate voltage connection is to a positive DC voltage source for an n-type RBT and to a negative DC voltage source for a p-type RBT.

8. The device according to claim 1, further comprising:
a DC voltage connection to a gate of each driving RBT; and
an RF signal connection to the gate or to a source terminal, a drain terminal, or a combination thereof, wherein a phase of the RF signal is an opposite phase of the RF signal at an adjacent RBT.

9. A device comprising:
resonant body transistors (RBTs), formed on an upper surface of a semiconductor layer, comprising even multiples of sensing RBTs and driving RBTs, each RBT including a piezoelectric gate dielectric layer, a gate, and a dielectric spacer on opposite sides of the piezoelectric gate dielectric layer and gate, wherein at least one pair of sensing RBTs is directly between two groups of driving RBTs;
a ferroelectric or anti-ferroelectric piezoelectric dielectric layer over source/drain (S/D) regions in the semiconductor layer and adjacent to each dielectric spacer;
metal layers, separated by interlayer dielectric layers, above the RBTs;
vias through a dielectric layer above the RBTs connecting the RBTs to a metal layer;
a direct current (DC) voltage connection to a gate of each sensing RBT to cause an inversion state in the sensing RBT; and
a combination of a DC voltage and a radio frequency (RF) signal connection to a source terminal, a drain terminal, or a combination thereof of the sensing RBT, wherein a phase of the RF signal is an opposite phase of the RF signal at an adjacent RBT.

10. The device according to claim 9, further comprising:
a DC voltage connection to a gate of each driving RBT; and
an RF signal connection to the gate or to a source terminal, a drain terminal, or a combination thereof, wherein a phase of the RF signal is an opposite phase of the RF signal at an adjacent RBT.

11. The device according to claim 9, wherein the metal layers are segmented for forming a two-dimensional phononic crystal.

12. The device according to claim 9, wherein the metal layers are solid layers and form a one-dimensional phononic crystal.

13. The device according to claim 11, further comprising:
a group of termination RBTs adjacent to the driving RBTs.

14. The device according to claim 9, wherein the DC gate voltage connection is to a positive DC voltage source for an n-type RBT and to a negative DC voltage source for a p-type RBT.

* * * * *